United States Patent
Yokota et al.

(10) Patent No.: US 10,297,428 B2
(45) Date of Patent: May 21, 2019

(54) PLASMA PROCESSING APPARATUS

(71) Applicant: TOKYO ELECTRON LIMITED, Tokyo (JP)

(72) Inventors: Akihiro Yokota, Miyagi (JP); Shinji Himori, Miyagi (JP); Tatsuro Ohshita, Miyagi (JP); Shu Kusano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 634 days.

(21) Appl. No.: 14/699,256

(22) Filed: Apr. 29, 2015

(65) Prior Publication Data

US 2015/0332898 A1 Nov. 19, 2015

(30) Foreign Application Priority Data

May 19, 2014 (JP) ................................. 2014-103118

(51) Int. Cl.
  *C23C 16/00* (2006.01)
  *C23F 1/00* (2006.01)
  *H01L 21/306* (2006.01)
  *H01J 37/32* (2006.01)
  (Continued)

(52) U.S. Cl.
  CPC ...... *H01J 37/32669* (2013.01); *C23C 16/455* (2013.01); *C23C 16/50* (2013.01); *H01J 37/3244* (2013.01); *H01J 37/3266* (2013.01); *H01J 37/32339* (2013.01); *H01J 37/32532* (2013.01)

(58) Field of Classification Search
  USPC ............... 156/345.46; 118/723 MR, 723 MA
  See application file for complete search history.

(56) References Cited

U.S. PATENT DOCUMENTS 4,842,707 A * 6/1989 Kinoshita ............... C23C 14/32
  118/723 E
5,113,790 A * 5/1992 Geisler ................. C23C 16/509
  118/723 E (Continued)

FOREIGN PATENT DOCUMENTS

CN  1663029 A  8/2005
CN  101764021 A  6/2010

(Continued)

*Primary Examiner* — Rakesh K Dhingra
(74) *Attorney, Agent, or Firm* — Rothwell, Figg, Ernst & Manbeck, P.C.

(57) ABSTRACT

Provided is a plasma processing apparatus that performs a processing on a processing target substrate by applying plasma of a processing gas on the processing target substrate. The plasma processing apparatus includes: a processing container configured to accommodate the processing target substrate; a lower electrode disposed in the processing container to mount the processing target substrate thereon; an upper electrode disposed in the processing container to face the lower electrode with a processing space being interposed therebetween; a high frequency power source configured to apply a high frequency power between the upper electrode and the lower electrode; a main magnet unit including one or more annular main electromagnetic coils arranged around a central axis; and an auxiliary magnet unit configured to form a magnetic field that perpendicularly or obliquely crosses the central axis in the processing space.

11 Claims, 15 Drawing Sheets

(51) Int. Cl.
  *C23C 16/50* (2006.01)
  *C23C 16/455* (2006.01)

(56) References Cited

U.S. PATENT DOCUMENTS

| | | | | |
|---|---|---|---|---|
| 6,245,190 B1* | 6/2001 | Masuda | ............ | H01J 37/32082 118/723 MA |
| 6,287,980 B1* | 9/2001 | Hanazaki | ............ | H01J 37/3244 156/345.28 |
| 2002/0179249 A1* | 12/2002 | Morimoto | ......... | H01J 37/32623 156/345.46 |
| 2002/0182131 A1* | 12/2002 | Kaushal | ............. | B01D 53/8662 422/198 |
| 2005/0263390 A1* | 12/2005 | Gung | .................... | C23C 14/046 204/192.17 |
| 2008/0257261 A1* | 10/2008 | Hanawa | ............ | H01J 37/32623 118/719 |
| 2010/0294656 A1* | 11/2010 | Ikeda | ................ | H01J 37/32091 204/298.11 |

FOREIGN PATENT DOCUMENTS

| | | |
|---|---|---|
| JP | 63-240022 A | 10/1988 |
| JP | 5-267237 A | 10/1993 |
| JP | 3037848 B2 | 5/2000 |
| JP | 2002-93784 A | 3/2002 |
| JP | 4107518 B2 | 6/2008 |

* cited by examiner

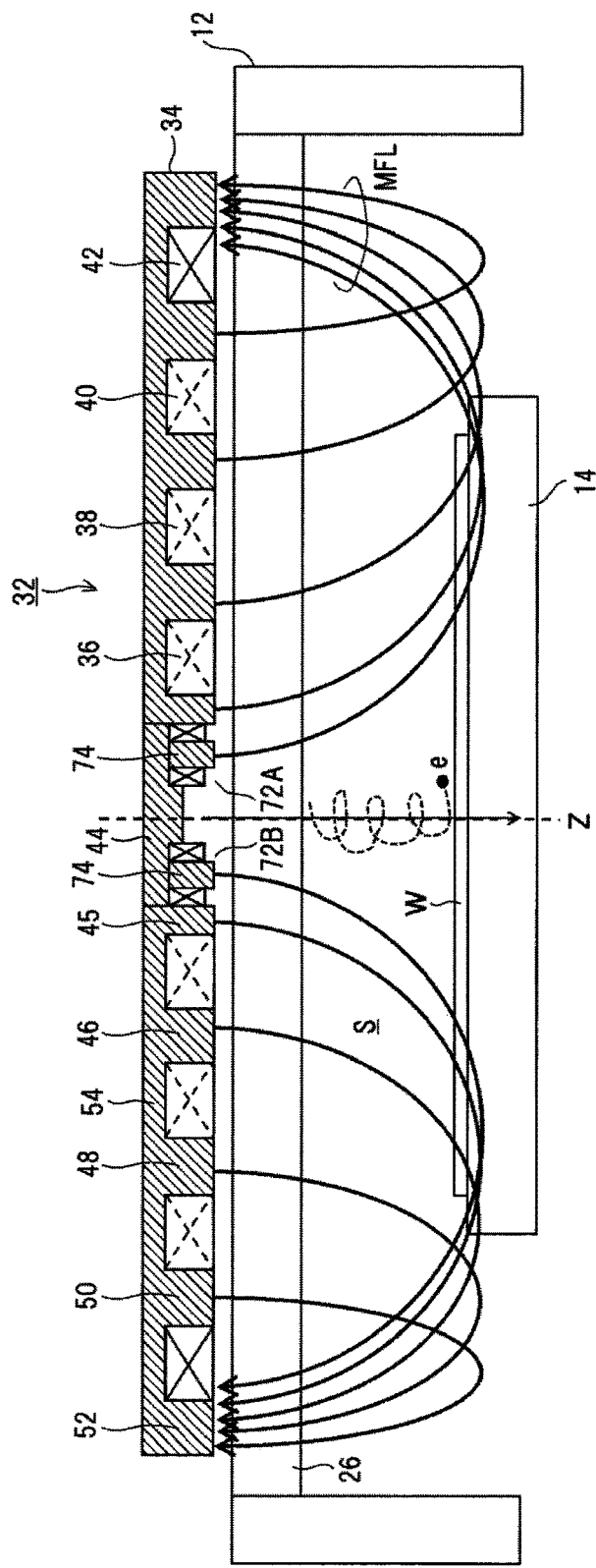

PLASMA PROCESSING APPARATUS

CROSS-REFERENCE TO RELATED APPLICATIONS

This application is based on and claims priority from Japanese Patent Application No. 2014-103118, filed on May 19, 2014, with the Japan Patent Office, the disclosure of which is incorporated herein in its entirety by reference.

TECHNICAL FIELD

The present disclosure relates to a capacitively coupled plasma processing apparatus.

BACKGROUND

In a semiconductor device manufacturing process, a plasma processing apparatus is used to perform a predetermined processing on a processing target substrate, for example, a semiconductor wafer, by reacting plasma of a processing gas with the processing target substrate. Conventionally, a capacitively coupled plasma etching apparatus is frequently used for single wafer plasma etching.

In general, the capacitively coupled plasma processing apparatus includes an upper electrode and a lower electrode which are arranged in parallel within a processing container configured as a vacuum chamber, in which a semiconductor wafer is mounted on the lower electrode and a high frequency power is applied between both electrodes. Then, plasma is generated between both electrodes due to high frequency discharge of the processing gas, and a plasma processing such as, for example, etching or film formation, is performed on a surface of a substrate by the radicals or ions included in the plasma.

In general, while high density plasma is generated in the capacitively coupled plasma processing apparatus by supplying a high frequency power to the lower electrode at a low pressure, a high frequency current generated by the high frequency power tends to gather in the vicinity of the center of the lower electrode in a case where the frequency of the supplied high frequency power is raised. When the high frequency current gathers in the vicinity of the center of the lower electrode, the density of plasma generated in the processing space between the lower electrode and the upper electrode and, moreover, a process characteristic on a semiconductor wafer (e.g., an etching rate in drying etching) tend to exhibit an upwardly convex profile having a peak in the vicinity of the center of the radial direction. In order to control plasma density distribution in the processing container, a conventionally known apparatus configuration includes a magnetic field forming mechanism to form a closed-loop magnetic field so that magnetic force lines pass through a processing space in a predetermined route.

For example, Japanese Patent No. 3037848 discloses a magnetic field forming mechanism, in which a rotating magnet having a N-pole and a S-pole which are sufficiently spaced apart from each other in a horizontal direction compared with the diameter of a processing target substrate is arranged on the ceiling of a processing container, and the rotating magnet is rotated around the central axis of the processing container as a rotation center so as to form a uniform magnetic field in the horizontal direction in a processing space within the processing container. In addition, Japanese Patent No. 4107518 discloses a magnetic field forming mechanism, in which a plurality of annular electrodes is arranged concentrically to constitute an upper electrode, and a plurality of magnets is installed on the ceiling of a processing container to form a horizontal magnetic field immediately below each of the annular electrodes within the processing space.

SUMMARY

According to one aspect of the present invention, there is provided a plasma processing apparatus that performs a processing on a processing target substrate by applying plasma of a processing gas on the processing target substrate. The plasma processing apparatus includes: a processing container configured to accommodate the processing target substrate to be loadable/unloadable; a lower electrode disposed in the processing container so as to mount the processing target substrate thereon; an upper electrode disposed in the processing container to face the lower electrode with a processing space being interposed therebetween; a high frequency power source configured to apply a high frequency power between the upper electrode and the lower electrode; a main magnet unit including one or more annular main electromagnetic coils arranged around a central axis passing through the center of the lower electrode in a vertical direction from an upper portion or upper side of the processing container; and an auxiliary magnet unit configured to form a magnetic field that perpendicularly or obliquely crosses the central axis in the processing space.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3B is a view illustrating an image of magnetic force lines of a magnetic field formed in the processing space when current is supplied to the outermost main electromagnetic coil of the main magnet unit.

DETAILED DESCRIPTION

Figure 1:
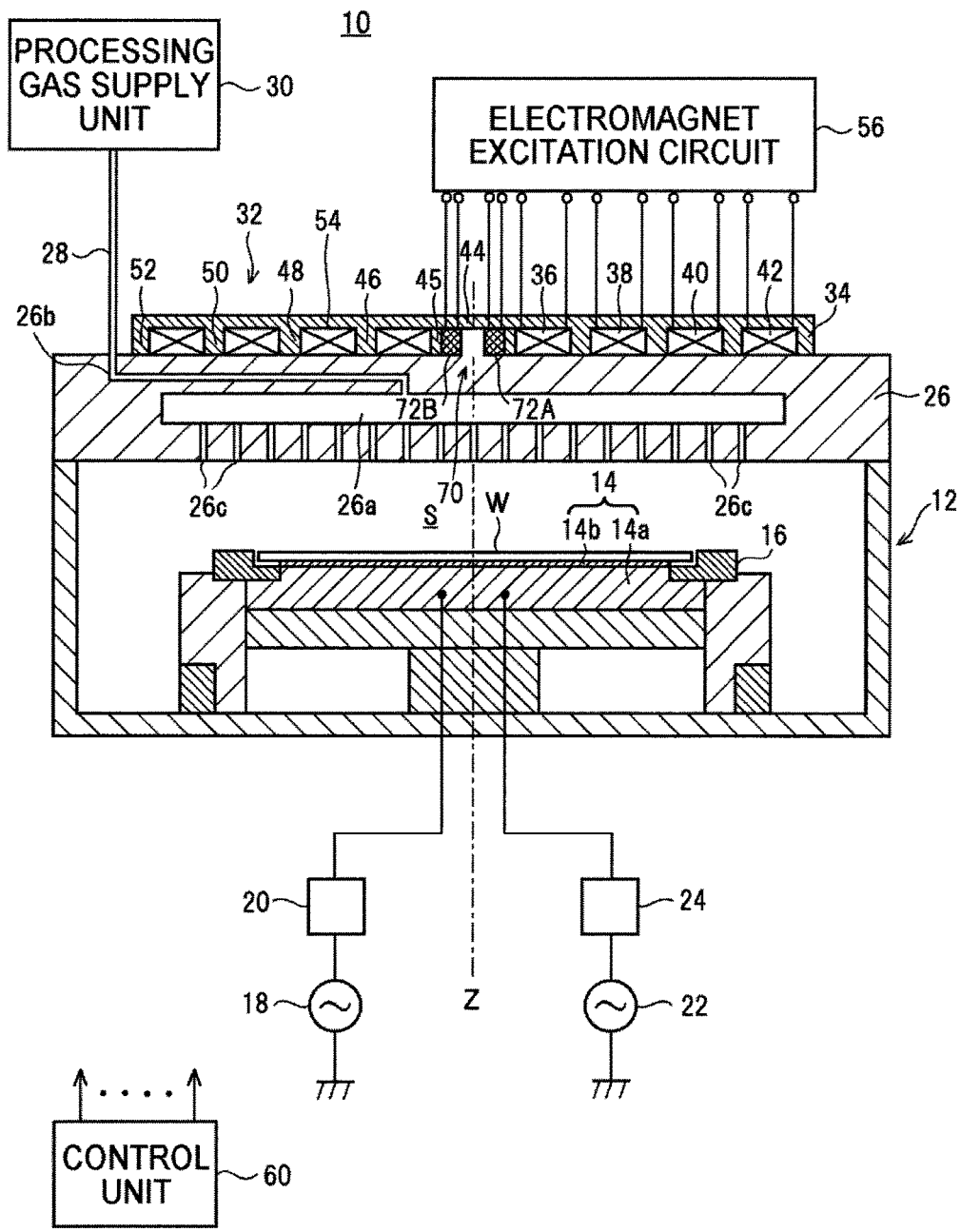
FIG. 1 is a sectional view schematically illustrating a capacitively coupled plasma processing apparatus in an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The conventional magnetic field forming mechanisms for a capacitively coupled plasma processing apparatus are not sufficient in terms of effects or the degree of freedom as a control knob for controlling plasma density distribution within the processing container. In particular, there is no apparatus for effectively solving a conventional problem in which the density of plasma abnormally increases at the center of the radial direction (i.e. the center becomes a singular point).

The present disclosure has been made in consideration of the above-described problems in the related art and provides a capacitively coupled plasma processing apparatus which is capable of effectively solving undesirable non-uniformity in which the center of the radial direction in plasma density distribution becomes a singular point.

A plasma processing apparatus in the present disclosure is a plasma processing apparatus that performs a processing on a processing target substrate by applying plasma of a processing gas on the processing target substrate. The plasma processing apparatus includes: a processing container configured to accommodate the processing target substrate to be loadable/unloadable; a lower electrode disposed in the processing container so as to mount the processing target substrate thereon; an upper electrode disposed in the processing container to face the lower electrode with a processing space being interposed therebetween; a high frequency power source configured to apply a high frequency power between the upper electrode and the lower electrode; a main magnet unit including one or more annular main electromagnetic coils arranged around a central axis passing through the center of the lower electrode in a vertical direction from an upper portion or upper side of the processing container; and an auxiliary magnet unit configured to form a magnetic field that perpendicularly or obliquely crosses the central axis in the processing space.

In the apparatus configuration as described above, when the main magnet unit and the auxiliary magnet unit are simultaneously excited, a combined magnetic field of a vector field acquired in a case where only the main magnet unit is excited and a vector field acquired in a case where only the auxiliary magnet unit is excited is formed at each position in a processing space. In particular, since the vector of a magnetic field formed by the main magnet unit and the vector of a magnetic field formed by the auxiliary magnet unit on the central axis are combined with each other, an obliquely slanted magnetic field having a meaningful horizontal component may be acquired. As a result, a restriction or localization phenomenon of electrons by a vertical magnetic field in the vicinity of the central axis can be suppressed, and, moreover, the center of the radial direction in a plasma density distribution can be suppressed from becoming a singular point.

The auxiliary magnet unit includes one or more magnetic poles that are arranged, in the upper portion or the upper side of the processing container, radially inside or outside of any one of the annular coils and at positions offset from the central axis to face the processing space.

The auxiliary magnet unit includes one or more pairs of N-poles and S-poles arranged at point-symmetrical positions about the central axis each to face the processing space.

The N-poles and the S-poles are respectively arranged in first and second sections which are bisected in a circumferential direction.

The auxiliary magnet unit includes at least one bar-shaped magnet, one pole of which is arranged to face the processing space, and an auxiliary yoke coupled to another pole of the bar-shaped magnet.

Each of the bar-shaped magnets includes at least one bar-shaped auxiliary iron core and an auxiliary electromagnetic coil mounted to the auxiliary iron core. The auxiliary iron core extends in parallel with the central axis at a position radially offset from the central axis by a given distance in a state where a tip end of the auxiliary iron core faces the processing space.

The auxiliary magnet unit rotates the poles facing the processing space in the circumferential direction around the central axis.

The main electromagnetic coils of the main magnet unit are concentrically arranged at a same height position.

The main magnet unit includes a main yoke that covers an inner circumferential surface, an outer circumferential surface and a top surface of each main electromagnetic coil, except for a bottom surface of the main electromagnetic coil.

According to a plasma processing apparatus of the present disclosure, through the configuration and operation as described above, it is possible to effectively solve undesirable non-uniformity in which the center of the radial direction in plasma density distribution becomes a singular point.

Hereinafter, exemplary embodiments of the present disclosure will be described with reference to the accompanying drawings. FIG. 1 is a sectional view schematically illustrating a capacitively coupled plasma processing apparatus in an exemplary embodiment. The plasma processing apparatus 10 is configured as a capacitively coupled plasma etching apparatus and includes a hermetically-sealable cylindrical chamber (processing container) 12 which accommodates, for example, a semiconductor wafer W of a 300 mm diameter to be loadable or unloadable.

A disc-shaped placing table 14, on which a semiconductor wafer W as a processing target is mounted, is located in the central lower region of the chamber 12. The placing table 14 includes a base 14a and an electrostatic chuck 14b. The base 14a is constituted with a conductive member of, for example, aluminum.

An annular focus ring 16 is installed in the peripheral region of the top surface of the base 14a to surround the periphery of the semiconductor wafer W. In addition, the disc-shaped electrostatic chuck 14b is installed in the central region of the top surface of the base 14a. The electrostatic chuck 14b has an insulation film enclosing an electrode film. As a direct current (DC) voltage is supplied to the electrode film from a DC power source (not illustrated) so that the semiconductor wafer W is attracted and held by an electrostatic force generated by the electrostatic chuck 14b.

In a state where the semiconductor wafer W is mounted on the electrostatic chuck 14b, the central axis Z passing the center of the semiconductor wafer W in the up-and-down direction approximately coincides with the central axis of the base 14a and the electrostatic chuck 14b.

The base 14a configures a lower electrode. A first high frequency power source 18 that generates a high frequency power for plasma generation is electrically connected to the base 14a through a first matcher 20. The first high frequency power source 18 generates a high frequency power having a frequency of, for example, 100 MHz. The first matcher 20 has a matching circuit to match the output impedance of the high frequency power source 18 with the load impedance at the base stand (lower electrode) 14a side.

In this exemplary embodiment, the first high frequency power source 18 is adapted to output a pulsed high frequency power for plasma generation at a desired frequency (e.g., 50 kHz) and a desired duty ratio (e.g., 20%) which are suitable for high frequency discharge of a processing gas. When a plasma generation period and a plasma non-generation period are provided within one cycle of a pulse frequency in this way, accumulation of charges at a specific part on the semiconductor wafer W may be reduced. That is, even if the accumulation of charges occurs at the specific part having a high electron density on the semiconductor wafer W due to non-uniformity in the density of electrons in plasma during the plasma generation period, the accumulation of charges may be dissolved by distributing the charges to the periphery during the plasma non-generation period. In this way, for example, destruction of an insulation film on the wafer surface may be suppressed.

In addition, a second high frequency power source 22 for generating a high frequency bias power for ion drawing-in is electrically connected to the base stand 14a through a second matcher 24. The second high frequency power source 22 generates a high frequency power having a frequency (e.g., 3.2 MHz) suitable for controlling the energy of ions drawn into the semiconductor wafer W on the placing table 14. The second matcher 24 has a matching circuit to match the output impedance of the high frequency power source 22 with the load impedance at the lower electrode side.

An upper electrode 26 is placed above the placing table (lower electrode) 14 to face the placing table 14 with a processing space S being interposed therebetween. The upper electrode 26 constitutes a top plate of the chamber 12 and defines the processing space S from the top thereof. The upper electrode 26 is disposed such that the central axis thereof approximately coincides with the central axis Z of the placing table 14.

The upper electrode 26 also functions as a shower head to introduce a predetermined processing gas to the processing space S in a shower form. In this exemplary embodiment, the upper electrode 26 is formed with a buffer room 26a, an inner gas line 26b, and a plurality of gas holes 26c. The buffer room 26a is connected to a processing gas supply unit 30 through the inner gas line 26b and an outer gas line 28. The gas holes 26c of the upper electrode 26 extend downward from the buffer room 26a and are open toward the processing space S. Meanwhile, although not illustrated, an exhaust mechanism such as, for example, a turbo molecular pump (TMP) or a dry pump (DP) is connected to the bottom of the chamber 12. The processing space S in the chamber 12 may be maintained under a predetermined reduced pressure atmosphere.

A main magnet unit 32 and an auxiliary magnet unit 70 are arranged side by side on the upper electrode 26. Configurations and operations of the main magnet unit 32 and the auxiliary magnet unit 70 will be described later in detail.

In the plasma etching apparatus 10, a control unit 60 includes a single microcomputer or a plurality of microcomputers and controls individual operations of respective components inside the apparatus, more particularly, the high frequency power sources 18 and 22, the matchers 20 and 24, the processing gas supply unit 30, an electromagnet excitation circuit 56, and an exhaust device, and operations (sequence) of the entire apparatus according to software (programs) and recipe information stored in an external memory or an internal memory.

In addition, the control unit 60 is also connected to, for example, an operating panel (not illustrated) for a human-machine interface including an input device such as, for example, a keyboard or a display device such as, for example, a liquid crystal display, and an external memory device (not illustrated) that stores or accumulates various programs or various data such as, for example, recipes and setting values. In this exemplary embodiment, although the control unit 60 is illustrated as a single control unit, a plurality of control units may be employed in a form of sharing the functions of the control unit 60 in a parallel or hierarchical manner.

In the plasma etching apparatus 10, when performing dry etching on the semiconductor wafer W mounted on the placing table 14, a processing gas, i.e. an etching gas is supplied to the processing space S in the chamber 12 through the shower head (upper electrode) 26 from the processing gas supply unit 30, and a high frequency power is supplied from the first high frequency power source 18 to the placing table (lower electrode) 14 so as to generate a high frequency electric field between the upper electrode 26 and the placing table 14. Then, plasma is generated in the processing space S by a high frequency discharge of the processing gas. Then, an etching processing of a predetermined pattern defined by an etching mask may be performed on a processing target film on the surface of the semiconductor wafer W by radicals and ions that are generated as molecules or atoms of the processing gas are disassociated or ionized in the plasma. In addition, the energy of ions introduced to the semiconductor wafer W may be controlled by adjusting the high frequency bias power supplied from the second high frequency power source 22 to the placing table 14 serving as the lower electrode.

Since the plasma etching apparatus 10 uses a capacitively coupled plasma generation mechanism, the plasma density distribution in the processing space S and, moreover, the etching rate on the semiconductor wafer W tend to exhibit a gently sloping mountain-shaped profile having a peak in the vicinity of the center in the radial direction when the main magnet unit 32 and the auxiliary magnet unit 70 are not functioned. However, through overlapped or complex operations of the main magnet unit 32 and the auxiliary magnet unit 70 as described below, the plasma density distribution characteristic in the radial direction within the processing space S and, moreover, a process characteristic (in particular, an etching rate characteristic) on the semiconductor wafer W may be adjusted within a wide control range and with high flexibility. In addition, an undesired phenomenon in which the center of the radial direction becomes a projecting point or a singular point in the plasma density distribution characteristic or process characteristic may effectively be dissolved.

[Configuration and Operation of Main Magnet Unit]

The main magnet unit 32 is located coaxially with the upper electrode 26 and the lower electrode 14, and includes a main core or main yoke 34 and a plurality of main electromagnetic coils 36, 38, 40, and 42. The main yoke 34 has a configuration in which a core portion 44, a plurality of cylindrical portions 45, 46, 48, 50, and 52, and a base portion or back plate portion 54 are formed integrally with each other. The main yoke 34 is formed of a soft magnetic material. The back plate portion 54 horizontally extends and has an approximately circular plate shape. The core portion 44 has approximately a disc shape or circular column shape and is integrally formed with or coupled to the back plate portion 54 such that the central axis thereof follows the central axis Z.

Figure 2:
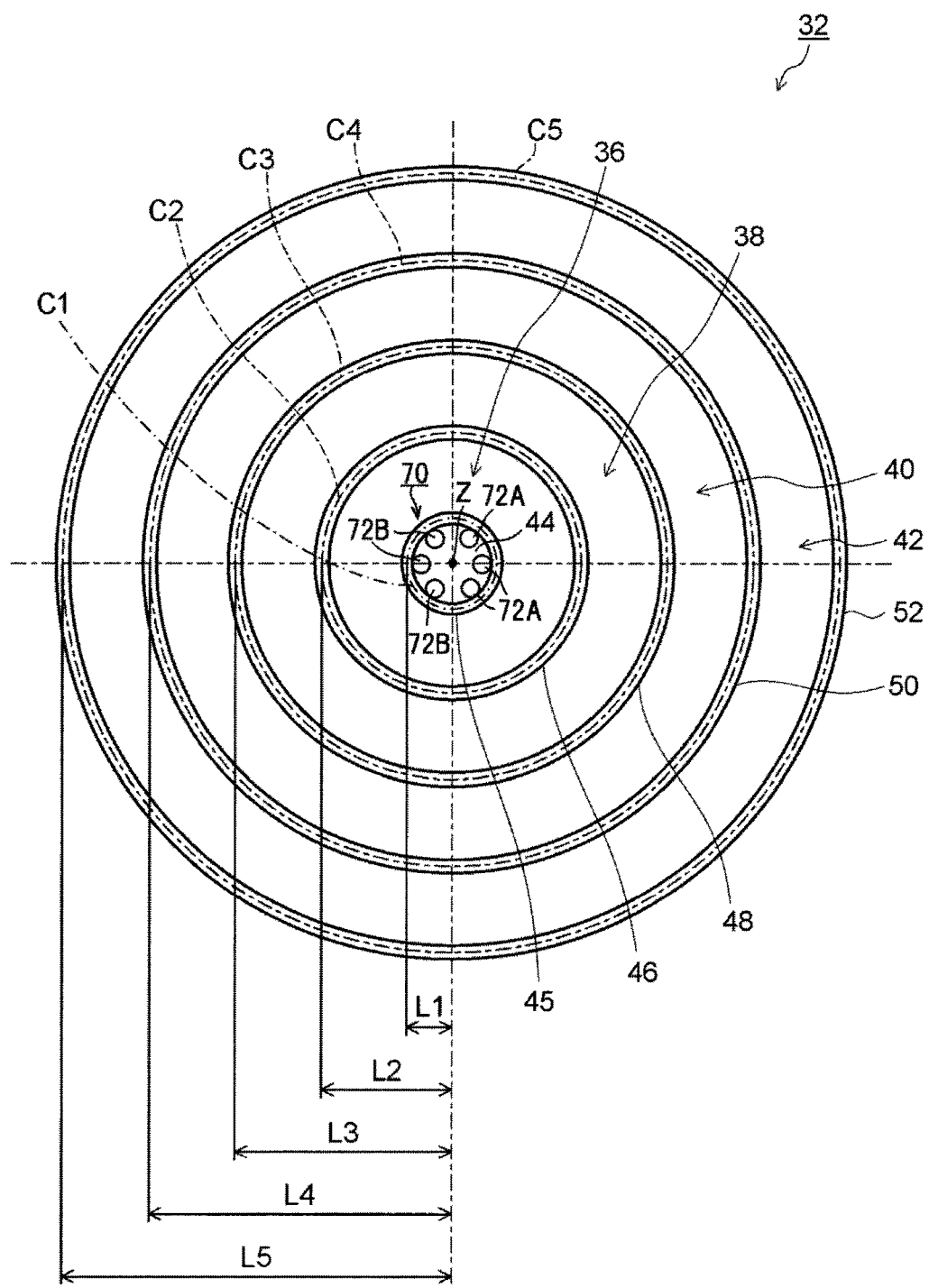
FIG. 2 is a plan view schematically illustrating a configuration of a main magnet unit and an auxiliary magnet unit in an exemplary embodiment.

The cylindrical portions 45, 46, 48, 50, and 52 are concentrically formed and respectively have a cylindrical shape extending in parallel with the central axis Z. More specifically, as illustrated in FIG. 2, the cylindrical portions 45, 46, 48, 50, and 52 are respectively formed along a plurality of concentric circles C1, C2, C3, C4, and C5 whose centers are the central axis Z. The cylindrical portion 45 is located along the concentric circle C1 having a radius L1. The cylindrical portion 46 is located along the concentric circle C2 having a radius L2 which is longer than the radius L1. The cylindrical portion 48 is located along the concentric circle C3 having a radius L3 which is longer than the radius L2. The cylindrical portion 50 is located along the concentric circle C4 having a radius L4 which is longer than the radius L3. The cylindrical portion 52 is located along the concentric circle C5 having a radius L5 which is longer than the radius L4.

In one example, the radii L1, L2, L3, L4, and L5 are 30 mm, 76 mm, 127 mm, 178 mm, and 229 mm, respectively. In addition, the central positions of the coils 36, 38, 40, and 42 are respectively disposed at approximately 50 mm, 100 mm, 150 mm, and 200 mm from the central axis Z.

The main yoke 34 includes a bottom-opened annular groove formed between the innermost cylindrical portion 45 and the cylindrical portion 46 adjacent thereto at the outside thereof. As illustrated in FIG. 1, the main electromagnetic coil 36, which is wound around the outer circumferential surface of the column-shaped portion 44, is received in the groove. In this way, the bottom surface of the main electromagnetic coil 36 is exposed and the inner surface, the outer surface, and the top surface of the main electromagnetic coil 36 are covered with the cylindrical portions 45 and 46 and the back plate portion 54 of the main yoke 34.

A bottom-opened annular groove is also formed between the cylindrical portion 46 and the cylindrical portion 48 adjacent thereto at the outside thereof. The main electromagnetic coil 38, which is wound around the outer circumferential surface of the cylindrical portion 46, is received in the groove. In this way, the bottom surface of the main electromagnetic coil 38 is exposed and the inner surface, the outer surface and the top surface of the main electromagnetic coil 38 are covered with the cylindrical portions 46 and 48 and the back plate portion 54 of the main yoke 34.

A bottom-opened annular groove is also formed between the cylindrical portion 48 and the cylindrical portion 50 adjacent thereto at the outside thereof. The main electromagnetic coil 40, which is wound around the outer circumferential surface of the cylindrical portion 48, is received in the groove. In this way, the bottom surface of the main electromagnetic coil 40 is exposed and the inner surface, the outer surface and the top surface of the main electromagnetic coil 40 are covered with the cylindrical portions 48 and 50 and the back plate portion 54 of the main yoke 34.

In addition, a bottom-opened annular groove is also formed between the cylindrical portion 50 and the cylindrical portion 52 adjacent thereto at the outside thereof, i.e. the outermost cylindrical portion 52. The main electromagnetic coil 42, which is wound around the outer circumferential surface of the cylindrical portion 50, is received in the groove. In this way, the bottom surface of the main electromagnetic coil 42 is exposed and the inner surface, the outer surface and the top surface of the main electromagnetic coil 40 are covered with the cylindrical portions 50 and 52 and the back plate portion 54 of the main yoke 34.

As described above, in the main magnet unit 32, the radii L4 and L5 are larger than the radius (150 mm) of the semiconductor wafer W. Thus, as illustrated in FIG. 1, the outermost main electromagnetic coil 42 is located radially outside of the outer peripheral edge of the semiconductor wafer W and at least a portion of the outermost main electromagnetic coil 42 is located above the focus ring 16. In addition, the innermost main electromagnetic coil 36 is located above the central portion of the semiconductor wafer W. The second main electromagnetic coil 38 from the coil center is located to extend over the central portion and the peripheral portion of the semiconductor wafer W in the radial direction. In addition, the third main electromagnetic coil 40 from the coil center is located to extend over the peripheral portion and the outside of the semiconductor wafer W in the radial direction.

Both ends of each of the main electromagnetic coils 36, 38, 40 and 42 are electrically connected to the electromagnet excitation circuit 56. The electromagnet excitation circuit 56 may alternatively apply an arbitrary excitation current to any one of the main electromagnetic coils 36, 38, 40 and 42 and may also apply a common or individual arbitrary excitation current to arbitrary coil combinations or a plurality of coils simultaneously under the control of the control unit 60 as described below.

With the main magnet unit 32 configured as described above, when a current is supplied to one or more main electromagnetic coils among the main electromagnetic coils 36, 38, 40, and 42, a magnetic field B is formed in such a manner that magnetic force lines MFL penetrating the inside of the respective electrically conducted main electromagnetic coils pass through the processing space S while drawing U-shaped loops point-symmetrically about the central axis Z in the vertical plane.

Figure 3A:
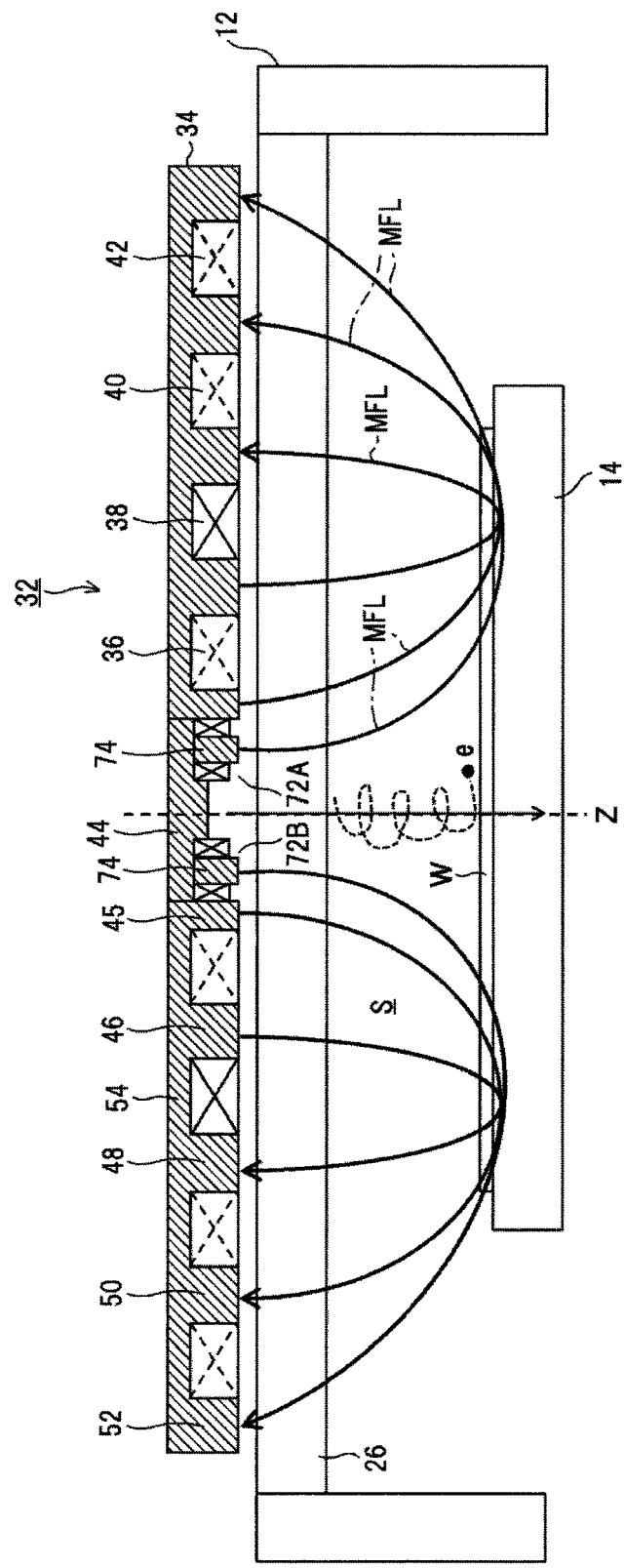
FIG. 3A is a view illustrating an image of magnetic force lines of a magnetic field formed in a processing space when a current is supplied to a second main electromagnetic coil from the inner side of the main magnet unit.

FIG. 3A illustrates an image of magnetic force lines MFL extending from the main magnet unit 32 to the interior of the processing space S when a current is supplied to the second main electromagnetic coil 38 from the coil center. In this case, the magnetic force lines MFL, which come out from the bottom surfaces of the respective portions of the main yoke 34 located radially inside of the main electromagnetic coil 38, i.e. from the lower ends of the core portion 44 and the cylindrical portions 45 and 46, extend radially outward over the bottom side of the main electromagnetic coil 38 while drawing U-shaped loops point-symmetrically about the central axis Z in the vertical plane, thereby reaching the bottom surfaces of each portion of the main yoke 34 located radially outside of the main electromagnetic coil 38, i.e. any one lower end of the cylindrical portions 48, 50 and 52. Then, each magnetic force line MFL, which has reached any one lower end of the cylindrical portions 48, 50 and 52, passes through the back plate portion 54 to return to any one of the core portion 44 and the cylindrical portions 45 and 46 in the main yoke 34.

In addition, radially inside of the innermost cylindrical portion 45, a plurality of bar-shaped electromagnets 72A and 72B, which constitutes the auxiliary magnet unit 70 as described below, vertically protrudes downward from the core portion 44 of the main yoke 34. Even if the bar-shaped electromagnets 72A and 72B are not excited, magnetic force lines MFL come out from the lower ends of respective bar-shaped iron cores (auxiliary iron cores) 74 through the main yoke 34. These magnetic force lines MFL pass through the processing space S while drawing U-shaped loops, thereby reaching the lower end of any one of the cylindrical portions 48, 50 and 52 as described above.

Figure 4A:
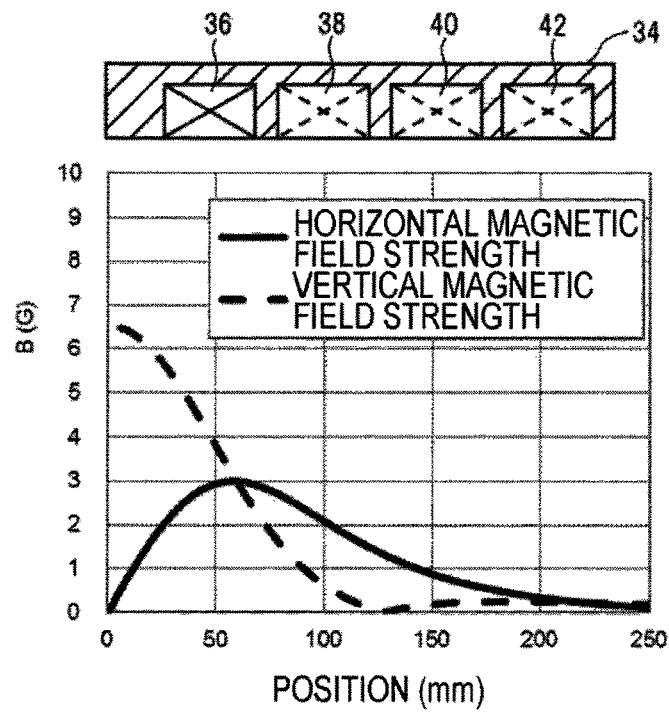
FIG. 4A is a view illustrating a magnetic field strength distribution formed in the processing space when a current is supplied to the innermost main electromagnetic coil of the main magnet unit.
Figure 4B:
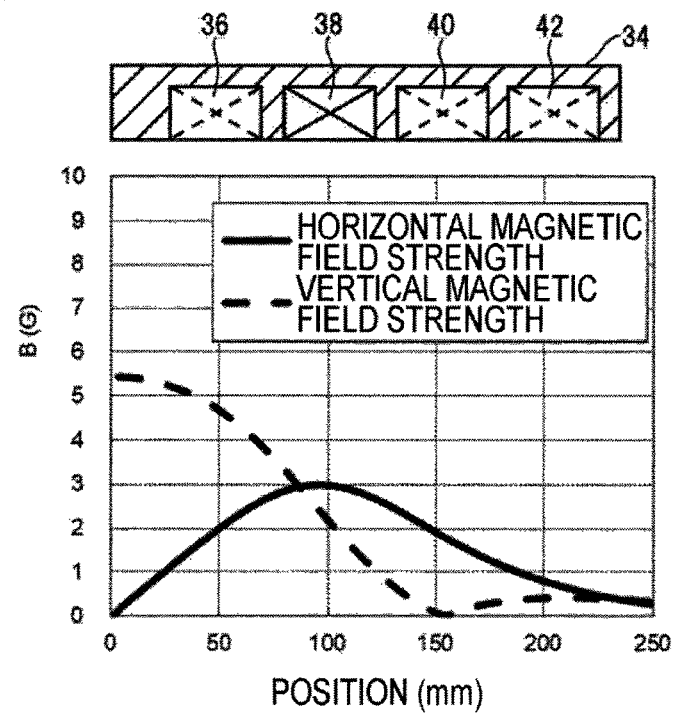
FIG. 4B is a view illustrating a magnetic field strength distribution formed in the processing space when a current is supplied to a second main electromagnetic coil from the center of the main magnet unit.

In a case where only the main electromagnetic coil 38 of the main magnet unit 32 is excited as described above, the distribution of a horizontal component strength (horizontal magnetic field strength) of the magnetic field B in the radial direction within the processing space S has a relatively steep mountain-shaped profile having a peak in the vicinity of a region immediately below the main electromagnetic coil 38, as illustrated in FIG. 4B.

FIG. 3B illustrates an image of magnetic force lines MFL extending from the main magnet unit 32 to the interior of the processing space S when a current is supplied to the outermost main electromagnetic coil 42. In this case, the magnetic force lines MFL, which come out from the bottom surfaces of the respective portions of the main yoke 34 located radially inside of the main electromagnetic coil 42, i.e. from the lower ends of the core portion 44 and the cylindrical portions 45, 46, 48, and 50, as well as the magnetic force lines MFL, which come out from the lower ends of the respective bar-shaped iron cores 74, extend radially outward over the bottom side of the main electromagnetic coil 42 while drawing U-shaped loops point-symmetrically about the central axis Z in the vertical plane, thereby reaching the bottom surface of each portion of the main yoke 34 located radially outside of the main electromagnetic coil 42, i.e. the lower end of the cylindrical portion 52 located radially outside of the main yoke 34. Then, each magnetic force line MFL, which has reached the lower end of the cylindrical portion 52, passes through the back plate portion 54 and returns to any one of the core portion 44, the cylindrical portions 45, 46, 48 and 52 and the bar-shaped iron cores 74 within the main yoke 34.

Figure 4C:
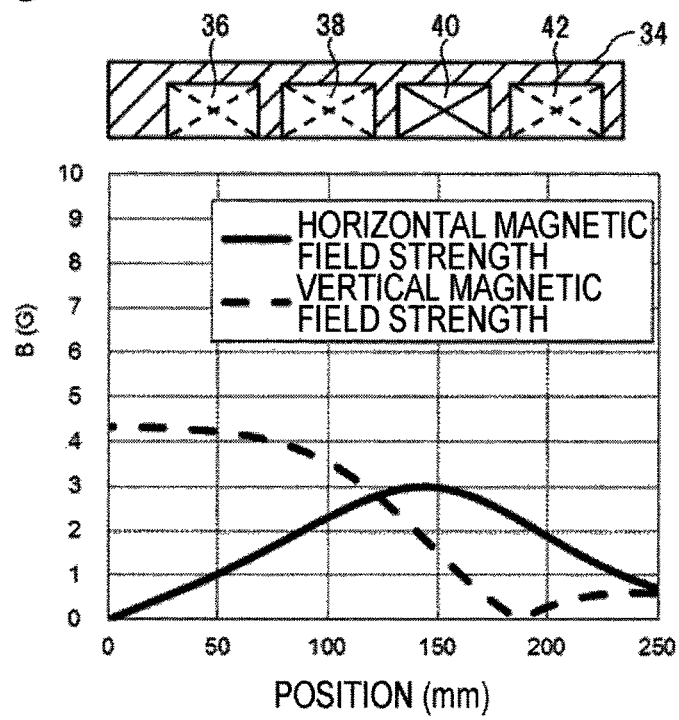
FIG. 4C is a view illustrating a magnetic field strength distribution formed in the processing space when a current is supplied to a third main electromagnetic coil from the center of the main magnet unit.
Figure 4D:
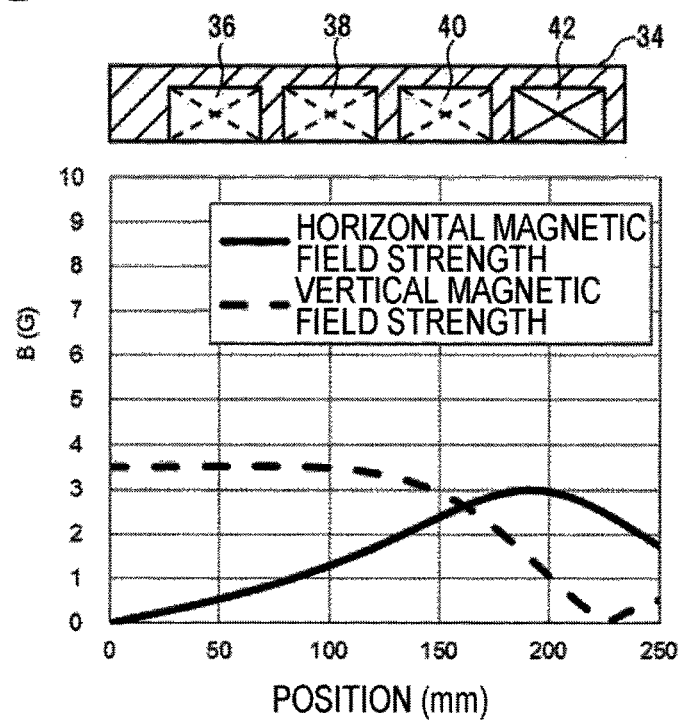
FIG. 4D is a view illustrating a magnetic field strength distribution formed in the processing space when a current is supplied to the outermost main electromagnetic coil of the main magnet unit.

In a case where only the main electromagnetic coil 42 of the main magnet unit 32 is excited as described above, the distribution of a horizontal component strength (horizontal magnetic field strength) of the magnetic field B in the radial direction within the processing space S has a relatively steep mountain-shaped profile having a peak in the vicinity of a region immediately below the main electromagnetic coil 42, as illustrated in FIG. 4D.

Even when a current is supplied to any one of the other main electromagnetic coils 36 and 40, the magnetic field B is formed such that magnetic force lines MFL penetrating the respective electrically conducted main electromagnetic coils 36 and 40 pass through the processing space S while drawing U-shaped loops point-symmetrically about the central axis Z in the vertical plane, similar to the case illustrated in FIG. 3A or 3B. In addition, in a case where a current is applied to only the innermost main electromagnetic coil 36, the distribution of a horizontal component strength (horizontal magnetic field strength) of the magnetic field B in the radial direction within the processing space S has a relatively steep mountain-shaped profile having a peak in the vicinity of a region immediately below the main electromagnetic coil 36 as illustrated in FIG. 4A. In addition, in a case where a current is applied to only the main electromagnetic coil 40 that is the third from the inner side (or the second from the outer side), the distribution of a horizontal component strength (horizontal magnetic field strength) of the magnetic field B in the radial direction within the processing space S has a relatively steep mountain-shaped profile having a peak in the vicinity of a region immediately below the main electromagnetic coil 40, as illustrated in FIG. 4C.

Figure 4E:
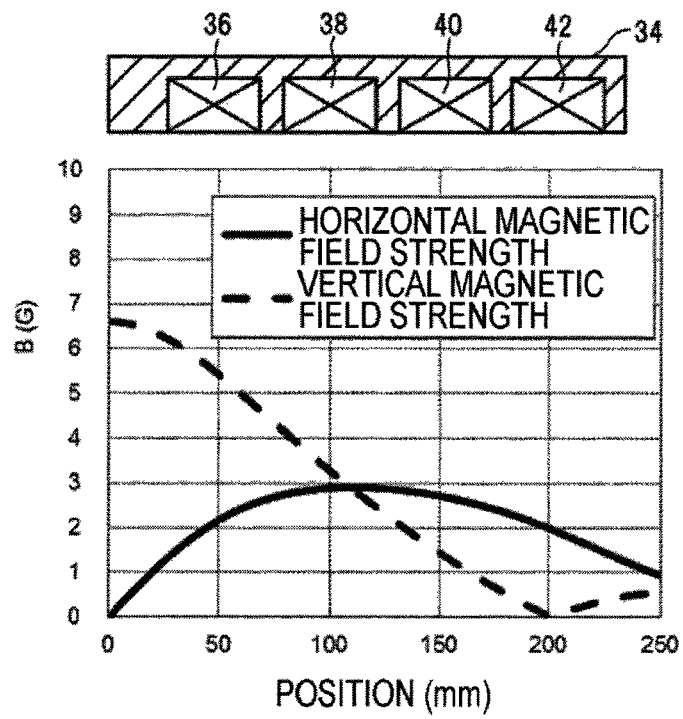
FIG. 4E is a view illustrating a magnetic field strength distribution formed in the processing space when a current is supplied to all main electromagnetic coils of the main magnet unit.

In addition, when a current is supplied to two or more of the main electromagnetic coils 36, 38, 40 and 42, a combined magnetic field of vector fields acquired when the current is separately applied to the respective coils is formed in the processing space S via overlap of the vector fields. In this case, the distribution of a horizontal component strength (horizontal magnetic field strength) of the magnetic field B in the radial direction within the processing space S has a gently sloping mountain-shaped or trapezoidal profile having a peak in the vicinity of a region immediately below the main electromagnetic coils 38 and 40 at the central portion, as illustrated in FIG. 4E.

In the plasma processing apparatus, when a magnetic field is present in the processing space of the chamber, electrons in plasma, in particular, electrons in bulk plasma repeatedly collide with gas molecules while performing a cyclotron motion (rotation) upon receiving the Lorenz force so that the number of ionizing collisions per unit time increases and thus, plasma density increases. Here, the Lorenz force depends on the vector product of the velocity of electrons and the magnetic field. Since the movement direction of electrons is random in the bulk plasma, the density of plasma or the number of ionizing collisions based on the Lorenz force increases as the magnetic field strength increases in the places with the same magnetic field direction.

In the plasma processing apparatus of the present exemplary embodiment, as described above, when the current is selectively applied to one or more of the main electromagnetic coils 36, 38, 40 and 42 of the main magnet unit 32, the distribution of a horizontal component strength (horizontal magnetic field strength) of the magnetic field B in the radial direction within the processing space S may be adjusted within a wide control range and with high flexibility. Moreover, a plasma density distribution and an etching rate in the radial direction may be controlled within a wide control range and with high flexibility.

However, as illustrated in FIGS. 4A to 4E, even if the current is applied to any one of the main electromagnetic coils 36, 38, 40 and 42, the horizontal component strength (horizontal magnetic field strength) of the magnetic field B is substantially 0 (zero) at the center of the processing space S (a place where the central axis Z passes) an, instead, the vertical component strength (vertical magnetic field strength) reaches a peak. Therefore, as illustrated in FIGS. 3A and 3B, electrons, which receive the Lorenz force from the magnetic field B that is always vertical in the vicinity of the central axis Z, move in the up and down direction in the bulk plasma along vertical magnetic force lines while performing a cyclotron motion to be wound around the central axis Z. Upon encountering gas molecules during this movement, the electrons collide with and ionize the gas molecules. In this case, since the electrons are restricted to be in the vicinity of the central axis Z by the Lorenz force not to be diffused outwardly in the radial direction, the number of ionizing collisions in the vicinity of the central axis Z increases, which causes the plasma density distribution to have an abnormally projecting maximum point on the central axis Z.

Figure 5:
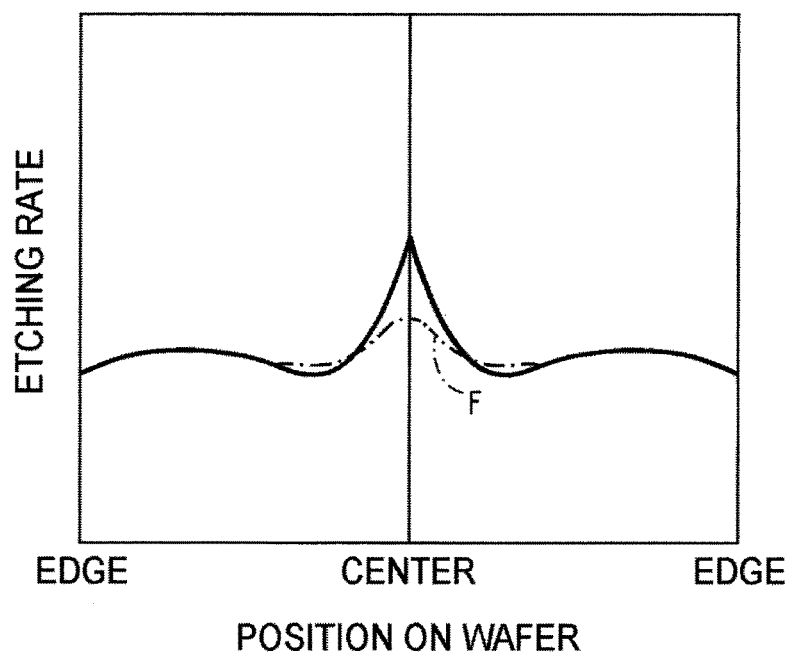
FIG. 5 is a view schematically illustrating the tendency of an etching rate on a wafer acquired in a case where only the main magnet unit is excited.

In this way, the position of the central axis Z (center position) becomes a singular point in the plasma density distribution. The singular point reduces the control range of strength distribution of a vertical magnetic field component and, moreover, degrades controllability of plasma density distribution. As a result, as schematically illustrated in FIG. 5, the etching rate on the semiconductor wafer W tends to steeply reach a peak at the center point.

In this exemplary embodiment, the auxiliary magnet unit 70, which will be described in detail below, may simply and efficiently solve the above-described problem remaining in a case where the main magnet unit 32 is used alone, i.e. a problem in which the center point of the radial direction becomes a singular point of the plasma density or process characteristic.

[Configuration and Operation of Auxiliary Magnet Unit]

Figure 6:
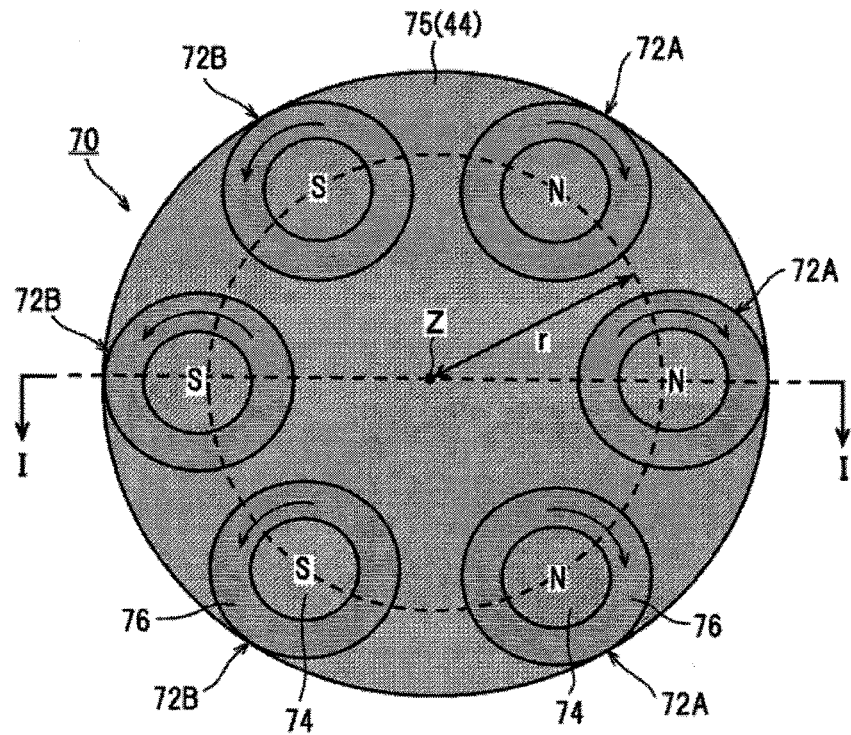
FIG. 6 is a plan view illustrating a configuration of the auxiliary magnet unit according to an exemplary embodiment.
Figure 7:
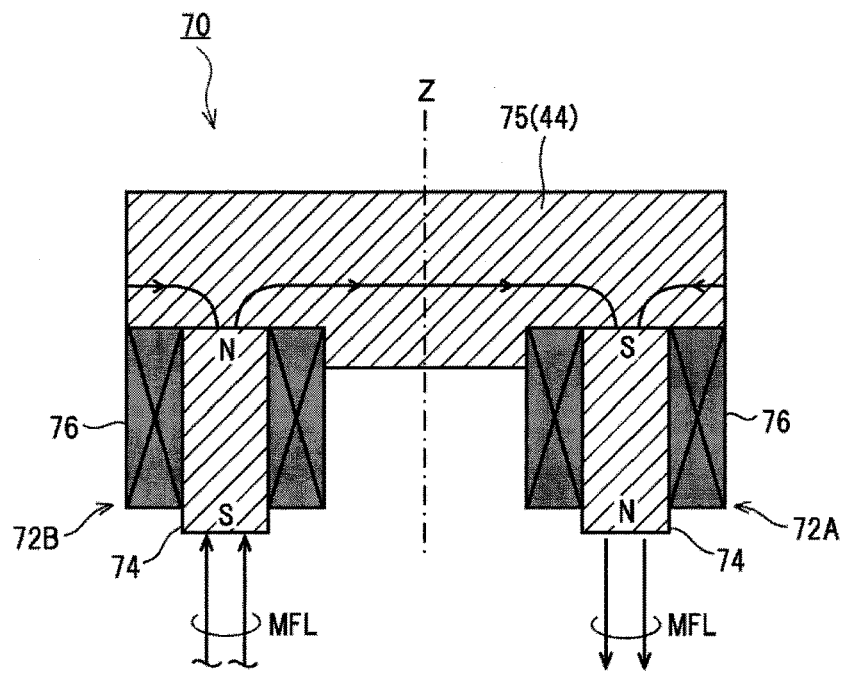
FIG. 7 is a sectional view taken along line I-I of FIG. 6.

A configuration of the auxiliary magnet unit 70 is illustrated in FIGS. 6 and 7. The auxiliary magnet unit 70 uses the core portion 44 of the main yoke 34 as an auxiliary yoke 75 and a plurality of (e.g., six) bar-shaped electromagnets 72 is mounted on the auxiliary yoke 75 at regular intervals in the circumferential direction at the positions radially offset from the central axis Z by a predetermined distance from a region radially inside of the innermost cylindrical portion 45 of the main magnet unit 32. Each of the bar-shaped electromagnets 72 has a bar-shaped auxiliary iron core 74 vertically extending downward from the bottom surface of the auxiliary yoke 75 and an auxiliary electromagnetic coil 76 wound around the auxiliary iron core 74. Both ends of each auxiliary electromagnetic coil 76 are electrically connected to the electromagnet excitation circuit 56. The electromagnet excitation circuit 56 may apply an arbitrary excitation current to the auxiliary electromagnetic coil 76 of each bar-shaped electromagnet 72 independently of the main electromagnetic coils 36, 38, 40, and 42 of the main magnet unit 32 under the control of the control unit 60, and may also simultaneously apply an arbitrary excitation current to the auxiliary electromagnetic coils 76 of arbitrary combinations of some or all of the bar-shaped electromagnets 72.

In a typical use form, as illustrated in FIG. 6, the bar-shaped electromagnets 72 are divided into two first and second sets of electromagnets 72A and 72B which are opposite to each other in the circumferential direction, such that a DC excitation current is applied with a constant current value in the forward (clockwise) direction to the auxiliary electromagnetic coils 76 of the bar-shaped electromagnets 72 selected as the first set and a DC excitation current is applied with the same current value in the backward (counterclockwise) direction to the auxiliary electromagnetic coils 76 of the bar-shaped electromagnets 72 selected as the second set. Then, as illustrated in FIG. 7, in the first set of bar-shaped electromagnets 72A, the lower ends become N-pole and the upper ends become S-poles. Meanwhile, in the second set of bar-shaped electromagnets 72B, the lower ends become S-poles and the upper ends become N-poles.

When viewed from the processing space S, as illustrated in FIG. 6, all of the N-poles of the first set of bar-shaped electromagnets 82A and all of the S-poles of the second set of bar-shaped electromagnets 72B are arranged respectively in bisected first and second semicircular sections in the circumferential direction. In addition, several pairs (in this case, three pairs) of N-poles and S-poles are arranged respectively at point-symmetrical positions about the central axis Z.

Figure 8:
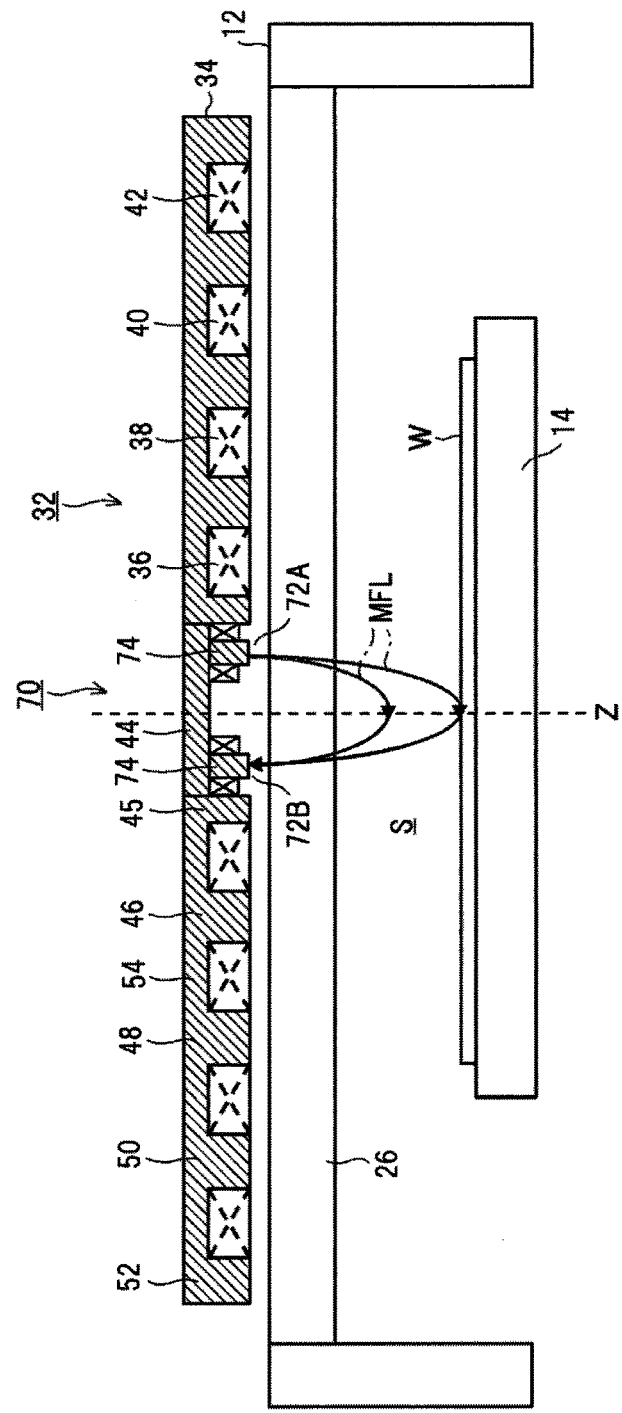
FIG. 8 is a view illustrating an image of magnetic force lines of a magnetic field formed in the processing space in a case where only the auxiliary magnet unit is excited.

FIG. 8 illustrates an image of magnetic force lines of a magnetic field formed in the processing space S in a case where the main magnet unit 73 remains unexcited and only the auxiliary magnet unit 70 is excited. In this case, the magnetic force lines MFL coming out from the lower ends (N-poles) of the auxiliary iron cores 74 of the first set of bar-shaped electromagnets 72A horizontally cross the central axis Z while drawing U-shaped loops point-symmetrically about the central axis Z in the vertical plane, thereby reaching the lower ends (S-poles) of the auxiliary iron cores 74 of the second set of opposite (point symmetrical) bar-shaped electromagnets 72B. At this time, magnetic force lines MFL going in and coming out from the cylindrical portions 45, 46, 48, 50 and 52 of the main yoke 34 hardly exist.

Figure 9:
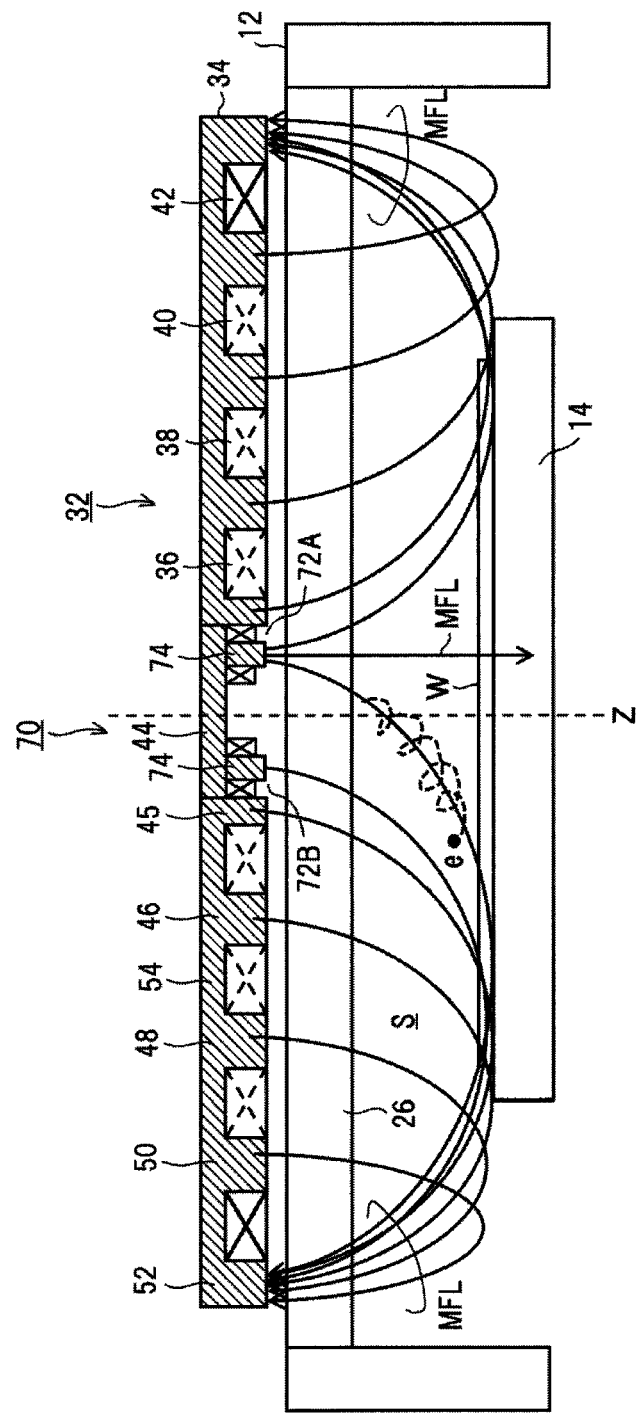
FIG. 9 is a view illustrating an image of magnetic force lines of a magnetic field formed in the processing space in a case where the main magnet unit and the auxiliary magnet unit are simultaneously excited.

FIG. 9 illustrates an image of magnetic force lines of a magnetic field formed in the processing space S in a case where the main magnet unit 32 and the auxiliary magnet unit 70 are simultaneously excited. The illustrated example corresponds to a case in which current is supplied to the outermost main electromagnetic coil 42 of the main magnet unit 32. In this case, a combined magnetic field B of a vector field acquired in a case where only the main magnet unit 32 is excited (FIG. 3B) and a vector field acquired in a case where only the auxiliary magnet unit 70 is excited (FIG. 8) is formed at each position in the processing space S. In particular, an obliquely slanted magnetic field having a significant horizontal component may be acquired as vectors (all or most of which are horizontal components) of a magnetic field formed by the auxiliary magnet unit 70 are combined with vectors (all or most of which are vertical components) of a magnetic field formed by the main magnet unit 32 on the central axis Z. Even when a current is supplied to some or all of the other main electromagnetic coils 36, 38 and 40, a similar combined magnetic field may be acquired in the vicinity of the central axis Z.

When the main magnet unit 32 and the auxiliary magnet unit 70 are simultaneously excited to form the obliquely slanted magnetic field B on the central axis Z in the processing space S, electrons e present in the vicinity of the central axis Z receive the Lorenz force from the obliquely slanted magnetic field B, thereby obliquely moving along magnetic force lines MFL while performing a cyclotron motion. Upon encountering gas molecules during this movement, the electrons collide with and ionize the gas molecules. In this case, since the electrons e obliquely move along the magnetic force lines MFL, ionizing collisions frequently occur even at a place relatively far from the central axis Z. As a result, plasma is diffused in the radial outward direction from the central axis Z, which causes a peak of the center point in plasma density distribution to be lowered. Accordingly, even in the etching rate on the semiconductor wafer W (FIG. 5), the peak of the center point is lowered as represented by a virtual line (one dot dashed line) F.

Meanwhile, as illustrated in FIG. 9, in the auxiliary magnet unit 70, magnetic force lines MFL come out from the auxiliary iron cores 74 of the first set of bar-shaped electromagnets 72A the auxiliary iron cores 74 of the second set of bar-shaped electromagnets 72A to the processing space S. This is because the density of magnetic flux generated by the main magnet unit 32 exceeds the density of a magnetic flux generated by the auxiliary magnet unit 70 even in the auxiliary iron cores 74 of the second set of bar-shaped electromagnet 72B. As a result of overlapping each other, the magnetic force lines MFL extend from the lower ends of the auxiliary iron cores 74 of the second set of bar-shaped electromagnet 72B.

As described above, even in the plasma etching apparatus of the exemplary embodiment, when the auxiliary magnet unit 70 is excited in addition to the main magnet unit 32, the problem remaining when the main magnet unit 32 is excited alone, i.e. the restriction or localization phenomenon of electrons by a vertical magnetic field in the vicinity of the central axis Z and, moreover, the generation of a singular point in plasma density distribution may be effectively suppressed.

[Magnetic Field Distribution Simulation of Exemplary Embodiment]

In order to check operations of the auxiliary magnet unit 70 in the exemplary embodiment, the inventors of the present disclosure obtained and compared, by calculation (simulation) using a computer, the distribution of a magnetic field (vector field) in the processing space S and the tracks of electrons in the vicinity of the central axis Z in a case where only the main magnet unit 32 is excited and the distribution of a magnetic field (vector field) in the processing space S and the tracks of electrons in the vicinity of the central axis Z in a case where the main magnet unit 32 and the auxiliary magnet unit 70 are simultaneously excited.

Figure 12:
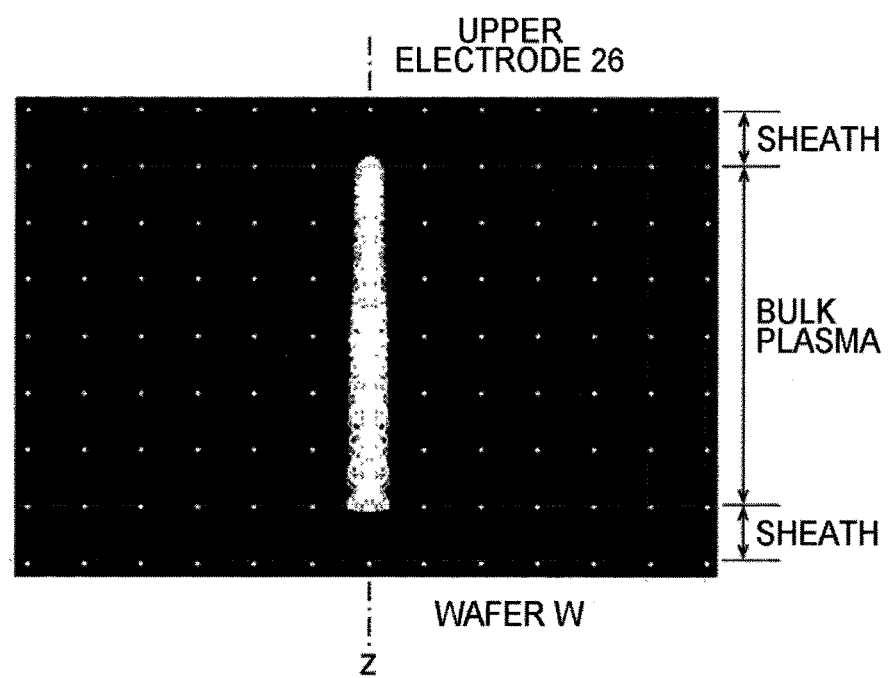
FIG. 12 is a view illustrating tracks of electrons acquired in the vicinity of the center of the processing space under the magnetic field distribution of FIG. 10.
Figure 15:
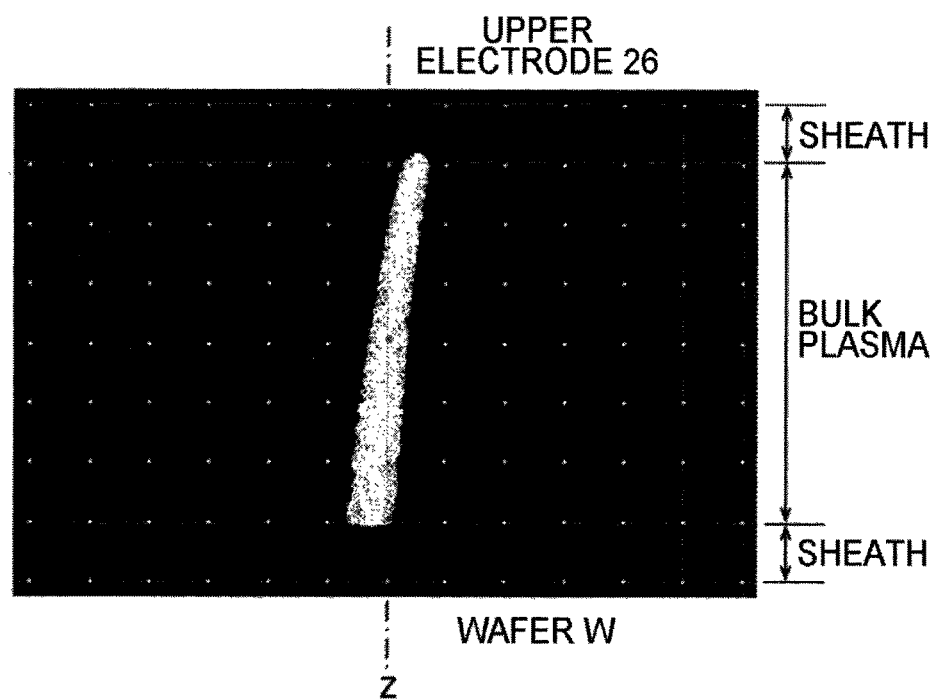
FIG. 15 is a view illustrating tracks of electrons acquired in the vicinity of the center of the processing space under the magnetic field distribution of FIG. 13.

In this simulation, the distance between the upper electrode 26 and the wafer W was set to 40 mm and each of the thicknesses of an ion sheath (upper sheath) formed on the surface of the upper electrode 26 and an ion sheath (lower sheath) formed on the surface of the wafer W was set to 5 mm. In addition, the electric potential of the upper electrode 26 was set to 0 V, the voltage applied to each of the upper sheath and the lower sheath was set to 100 V, and the electric potential of the lower electrode 14 was set to −200 V. In addition, the excitation current value supplied to each of the main magnet unit 32 and the auxiliary magnet unit 76 was set such that the magnetic field strength at the center of bulk plasma (at a lower position than the upper electrode 26 by 20 mm) is about 70 G. In the calculation of the tracks of electrons, the tracks of electrons that move upward or downward while performing the cyclotron motion were calculated by arranging 24 electrons at the central point (starting point) of bulk plasma on the central axis Z and radially releasing the 24 electrons toward 24 orientations by an interval of 15 degrees in the X-Z plane at the velocity of 2.65e6 (m/s) (20 ev). In FIGS. 12 and 15, the white lines shows the overlapped tracks of the 24 electrons calculated per 10 nsec during 50 μsec.

Figure 10:
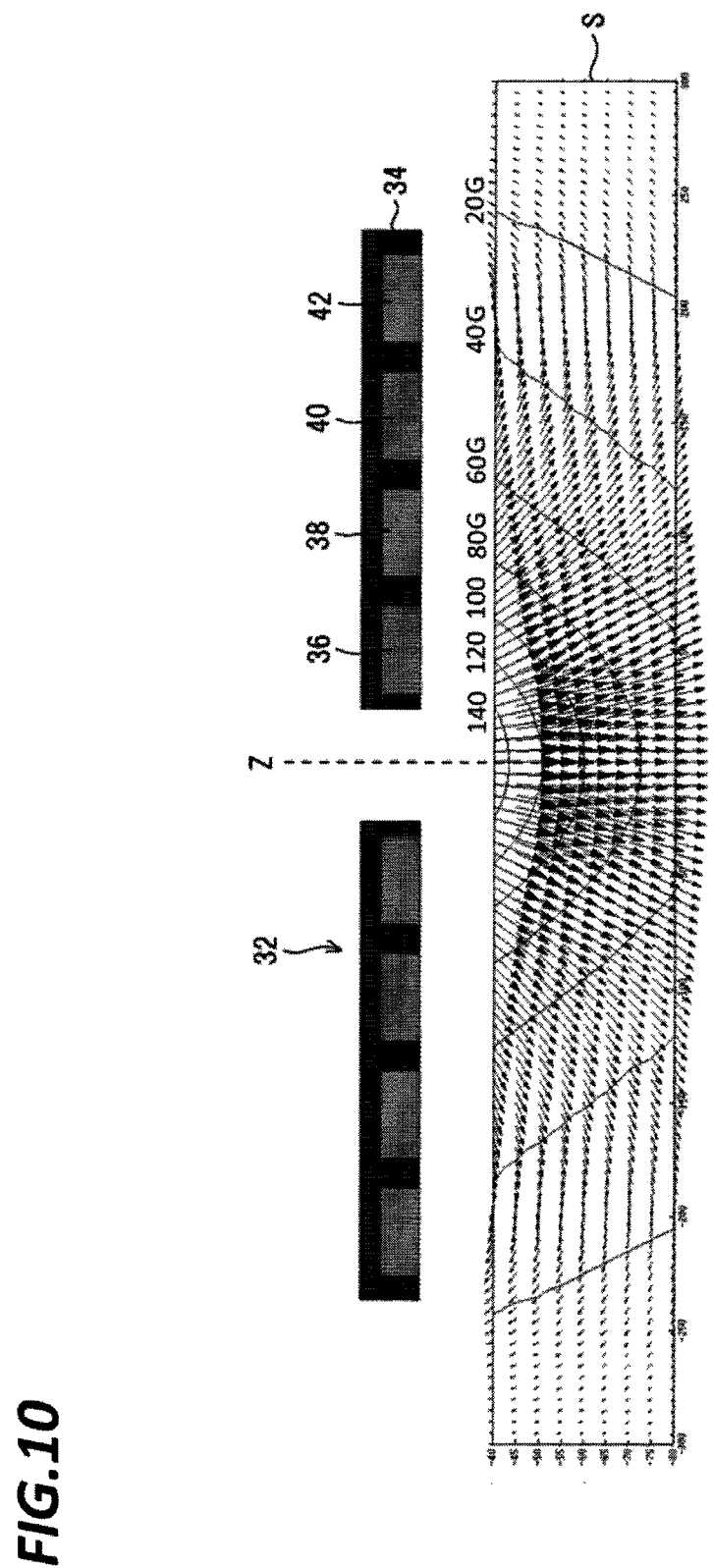
FIG. 10 is a view illustrating a magnetic field (vector field) distribution in the processing space in a case where only the main magnet unit is excited.
Figure 11:
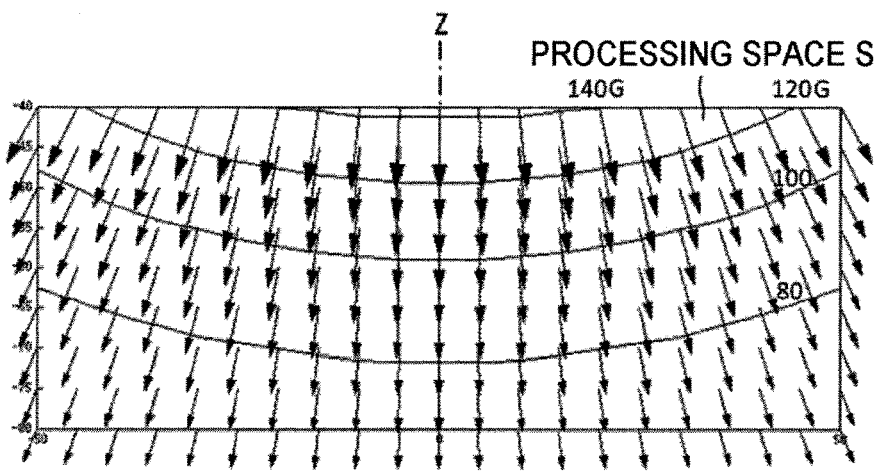
FIG. 11 is an enlarged view illustrating a central portion of the processing space of FIG. 10.

FIGS. 10 to 12 correspond to a case where only the main magnet unit 32 is excited. FIG. 10 illustrates a magnetic field (vector field) distribution in the entire processing space S, FIG. 11 illustrates the enlarged central portion of FIG. 10, and FIG. 12 illustrates the tracks of electrons.

As illustrated in FIGS. 10 and 11, a magnetic field in the vicinity of the central axis Z is continuously vertical from the bottom surface of the upper electrode 26 to the top surface of the wafer W and a gradient of the vector field from the central axis Z is 0 degrees. In this case, as illustrated in FIG. 12, it may be seen that the tracks of electrons are vertical along the central axis Z and the electrons move in bulk plasma in the up and down direction while performing a cyclotron motion to be wound around the central axis Z.

Figure 13:
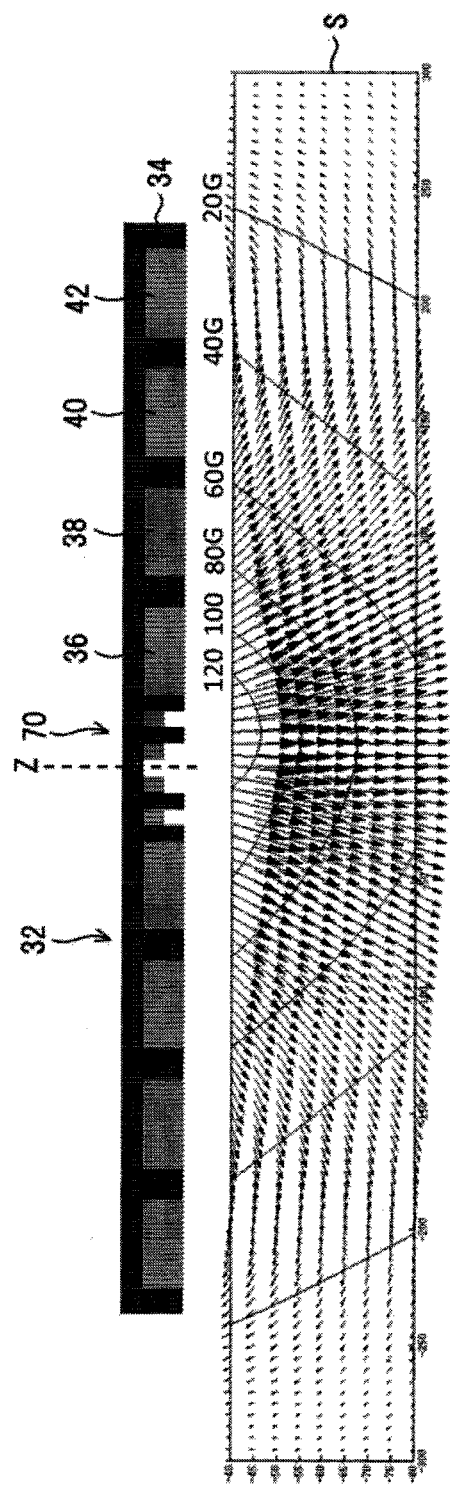
FIG. 13 is a view illustrating a magnetic field (vector field) distribution in the processing space in a case where the main magnet unit and the auxiliary magnet unit are simultaneously excited.
Figure 14:
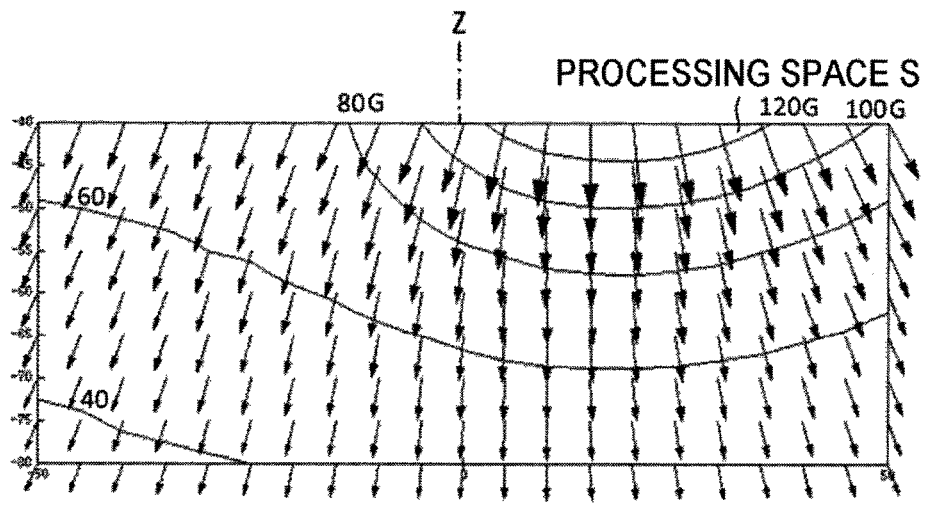
FIG. 14 is an enlarged view illustrating a central portion of the processing space of FIG. 13.

FIGS. 13 to 15 correspond to a case where the main magnet unit 32 and the auxiliary magnet unit 70 are simultaneously excited. FIG. 13 illustrates a magnetic field (vector field) distribution in the entire processing space S, FIG. 14 illustrates the enlarged central portion of FIG. 13, and FIG. 15 illustrates the tracks of electrons.

As illustrated in FIGS. 13 and 14, a magnetic field in the vicinity of the central axis Z is obliquely slanted by a greater angle with decreasing distance to the upper electrode 26 and the slant angle is reduced with an increase of distance from the upper electrode 26 (with decreasing distance to the wafer W). The gradient angle of the magnetic field at the center of bulk plasma on the central axis Z is 7 degrees. In this case, as illustrated in FIG. 15, it may be seen that the tracks of electrons obliquely extend by approximately the same angle as the magnetic field when the electrons move from the starting point to the upper electrode 26 as well as when the electrons move from the starting point to the wafer W.

[Other Embodiment and Alternative Embodiment]

The present disclosure is not limited to the above-described embodiments and various modifications may be made within the technical scope of the present disclosure.

For example, the auxiliary magnet unit 70 may turn the N-poles and the S-poles of the bar-shaped electromagnets 72, which include the auxiliary electromagnetic coils 76, upside down by reversing the direction of the current flowing to the respective auxiliary electromagnetic coils 76. That is, the control unit 60 may arbitrarily select, through the electromagnet excitation circuit 56, whether to set respective bar-shaped electromagnets 72 as the first set of bar-shaped electromagnets 72A, of which the N-poles faces the processing space S or as the second set of bar-shaped electromagnets 72B of which the S-poles face the processing space S.

Figure 16:
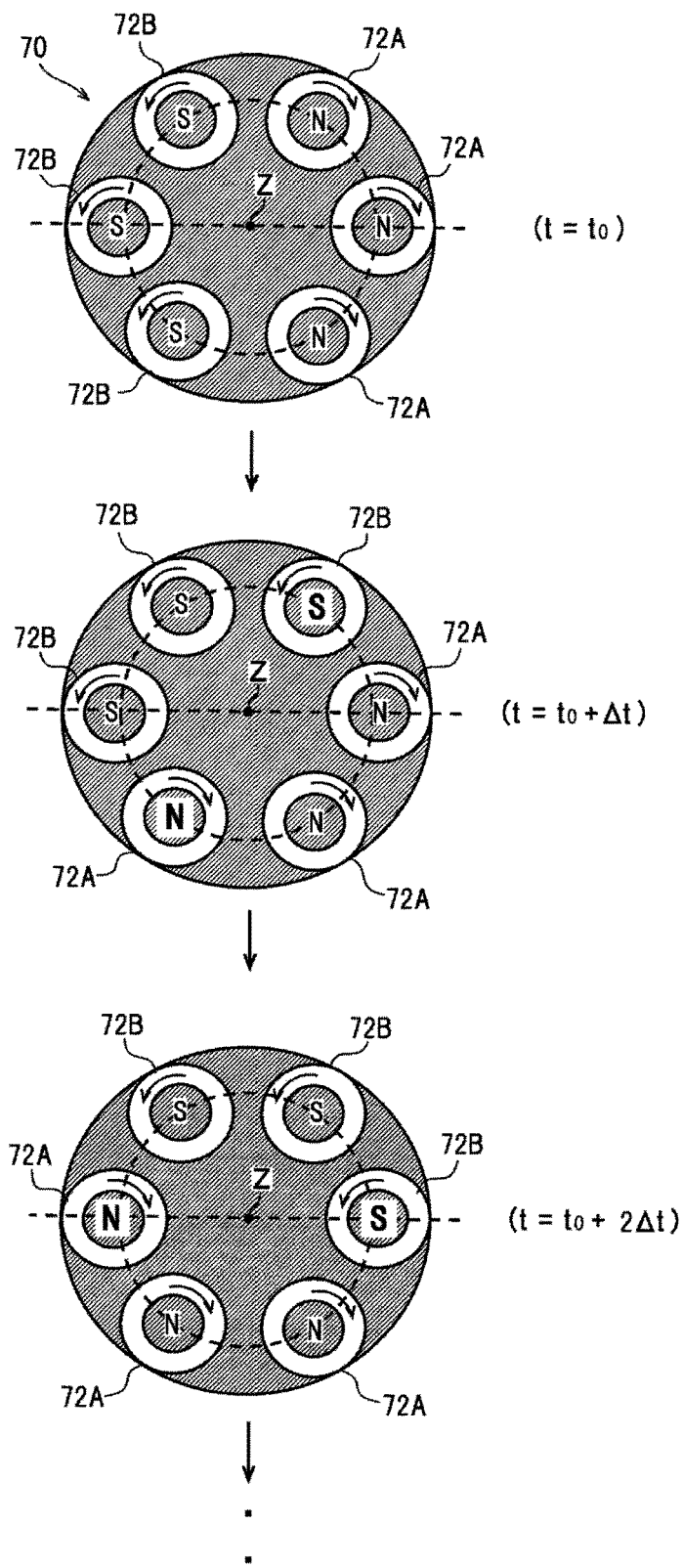
FIG. 16 is a view illustrating an aspect in which a group of magnetic poles (N pole/S pole) facing the processing space is rotated in the circumferential direction around the central axis in the auxiliary magnet unit according to an exemplary embodiment.

Accordingly, as illustrated in FIG. 16, the first set of (three) auxiliary electromagnets 72A and the second set of (three) auxiliary electromagnets 72B may be intermittently or successively moved along a rotational path at regular intervals Δt in the circumferential direction by sequentially reversing (interchanging) one pair of the first set and the second set of bar-shaped electromagnets 72A and 72B which are in a point-symmetrical positional relationship at the regular intervals Δt. In this way, when a group of magnetic poles (N-poles/S-poles) of the auxiliary magnet unit 70 facing the processing space S is rotated in the circumferential direction about the central axis Z, the effect of the auxiliary magnet unit 70 on the inside of the processing space S regarding the plasma density distribution may be leveled even in the circumferential direction, and as a result, the plasma density distribution may be uniformized even in the circumferential direction.

As another alternative embodiment, in the auxiliary magnet unit 70, the bar-shaped electromagnets 72 may be replaced with bar-shaped permanent magnets (not illustrated). In addition, although the effect of the auxiliary magnet unit 70 may be reduced by half, the auxiliary magnet unit 70 may have a configuration in which only the first set of bar-shaped electromagnets 72A or the second set of bar-shaped electromagnets 72B is provided.

In addition, as an alternative embodiment as to the installation position of the auxiliary magnet unit 70, each magnetic pole (e.g., each bar-shaped electromagnet 72 of the exemplary embodiment) of the auxiliary magnet unit 70 may be located radially outside of any one of the main electromagnetic coils 36 to 42 of the main magnet unit 32. Even in this case, the vectors (all or most of which are horizontal components) of the magnetic field generated by the auxiliary magnet unit 70 are combined with the vectors (all or most of which are horizontal components) of the magnetic field generated by the main magnet unit 32 an obliquely slanted magnetic field having a meaningful horizontal component may be acquired on the central axis Z.

The capacitively coupled plasma etching apparatus of the exemplary embodiment as described above employs a lower 2 frequency application method, in which the first high frequency power source 18 for plasma generation and the second high frequency power source 22 for ion drawing-in are connected to the placing table (lower electrode) 14 within the chamber 12. However, the present disclosure may also be applied to a configuration in which the first high frequency power source 18 for plasma generation is electrically connected to the upper electrode 26 and the second high frequency power source 22 for ion drawing-in is electrically connected to the placing table (lower electrode) 14.

The present disclosure is not limited to the plasma etching apparatus, and may also be applied to, for example, a capacitively coupled plasma CVD apparatus, a plasma oxidation apparatus, and a plasma nitrification apparatus. In addition, the processing target substrate in the present disclosure is not limited to a semiconductor wafer, and may also be applied to, for example, various substrates for a flat panel display, an organic EL, or a solar cell, a photomask, a CD substrate, or a printed substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus that performs a processing by applying plasma of a processing gas on a substrate to be processed, the apparatus comprising:
   a processing container configured to accommodate the substrate to be loadable/unloadable;
   a lower electrode disposed in the processing container so as to mount the substrate thereon;
   an upper electrode disposed in the processing container to face the lower electrode with a processing space being interposed therebetween;
   a high frequency power source configured to apply a high frequency power between the upper electrode and the lower electrode;
   a main magnet unit provided on a top surface of the upper electrode and including one or more annular main electromagnetic coils arranged around a common central axis passing through a center of the upper electrode and a center of the lower electrode in a vertical direction from an upper side of the main magnet unit, and a main yoke configured to cover the one or more annular main electromagnetic coils, the main magnet unit being configured to form a magnetic field that passes through the processing space while drawing U-shaped loops point-symmetrically about the common central axis in a vertical plane; and
   an auxiliary magnet unit provided radially inside of any one of the annular main electromagnetic coils on the top surface of the upper electrode, and including an auxiliary yoke formed by a core portion of the main yoke that has a predetermined radius from the common central axis and a plurality of bar-shaped electromagnets vertically protruding from a lower surface of the auxiliary yoke, wherein the bar-shaped electromagnets are offset from the common central axis by a given distance and arranged at regular intervals in a circumferential direction, the auxiliary magnet unit being configured to form a magnetic field that perpendicularly or obliquely crosses the common central axis in the processing space.

2. The apparatus according to claim 1, wherein the auxiliary magnet unit includes one or more magnetic poles that are arranged at positions offset from the common central axis to face the processing space.

3. The apparatus according to claim 2, wherein the auxiliary magnet unit rotates the one or more magnetic poles facing the processing space in a circumferential direction around the common central axis.

4. The apparatus according to claim 2, wherein the auxiliary magnet unit includes one or more pairs of N-poles and S-poles arranged at point-symmetrical positions about the common central axis each to face the processing space.

5. The apparatus according to claim 4, wherein the N-poles and the S-poles are respectively arranged in first and second sections which are bisected in a circumferential direction.

6. The apparatus according to claim 1,
   wherein one magnetic pole of one of the bar-shaped electromagnets is arranged to face the processing space, and the other magnetic pole of the one of the bar-shaped electromagnets is coupled to the auxiliary yoke.

7. The apparatus according to claim 6, wherein each of the bar-shaped electromagnets includes at least one bar-shaped auxiliary iron core and an auxiliary electromagnetic coil mounted to the auxiliary iron core, the auxiliary iron core extending downwardly from the lower surface of the auxiliary yoke in parallel with the common central axis to face the processing space.

8. The apparatus according to claim 1, wherein the main electromagnetic coils of the main magnet unit are concentrically arranged at a same height position.

9. The apparatus according to claim 1, wherein the main yoke of the main magnet unit is configured to cover an inner circumferential surface, an outer circumferential surface and a top surface of each main electromagnetic coil, except for a bottom surface of the main electromagnetic coil.

10. The apparatus according to claim 1, wherein the main magnet unit and the auxiliary magnet unit are simultaneously excited such that an obliquely slanted magnetic field is formed on the common central axis in the processing space.

11. The apparatus according to claim 1, wherein the high frequency power source is electrically connected to the lower electrode, and an additional high frequency power source is electrically connected to the upper electrode.

* * * * *